United States Patent [19]

Morishita et al.

[11] Patent Number: 4,697,138
[45] Date of Patent: Sep. 29, 1987

[54] LOGIC ANALYZER HAVING A PLURALITY OF SAMPLING CHANNELS

[75] Inventors: Mitsuhiro Morishita; Masayasu Sugimori, both of Tokyo, Japan

[73] Assignee: Ando Electric Co., Ltd., Tokyo, Japan

[21] Appl. No.: 875,817

[22] Filed: Jun. 18, 1986

[30] Foreign Application Priority Data

Jun. 20, 1985 [JP] Japan .................... 60-134711

[51] Int. Cl.$^4$ ............... G01R 15/00; G01R 31/28
[52] U.S. Cl. .................. 324/73 R; 324/73 AT; 324/121 R; 371/15; 371/20
[58] Field of Search ............ 324/73 R, 73 AT, 121 R, 324/; 371/20, 25, 15; 364/900; 340/825.52, 825.66

[56] References Cited

U.S. PATENT DOCUMENTS

| 4,195,258 | 3/1980 | Yen | 324/73 AT X |
| 4,364,036 | 12/1982 | Shimizu | 324/121 R X |
| 4,425,643 | 1/1984 | Chapman et al. | 324/73 R X |
| 4,513,395 | 4/1985 | Henry et al. | 364/900 |

Primary Examiner—Reinhard J. Eisenzopf
Assistant Examiner—Vinh P. Nguyen
Attorney, Agent, or Firm—Panitch Schwarze Jacobs and Nadel

[57] ABSTRACT

A logic analyzer includes a plurality of data sampling channels which are operative in response to respective different clock signals independent of one another. Information of the sequence in time in which the sampled data are produced in the plurality of the sampling channels is stored in a memory for the purpose of display. To this end, each of the sampling channels is provided with a clock discriminating circuit having two inputs supplied with a common clock signal generated internally and a clock signal specific to the associated sampling channel. The outputs of all the clock discriminating circuits are stored in a memory whose contents thus indicate the sequence in time in which the data are sampled in the plurality of the sampling channels.

2 Claims, 19 Drawing Figures

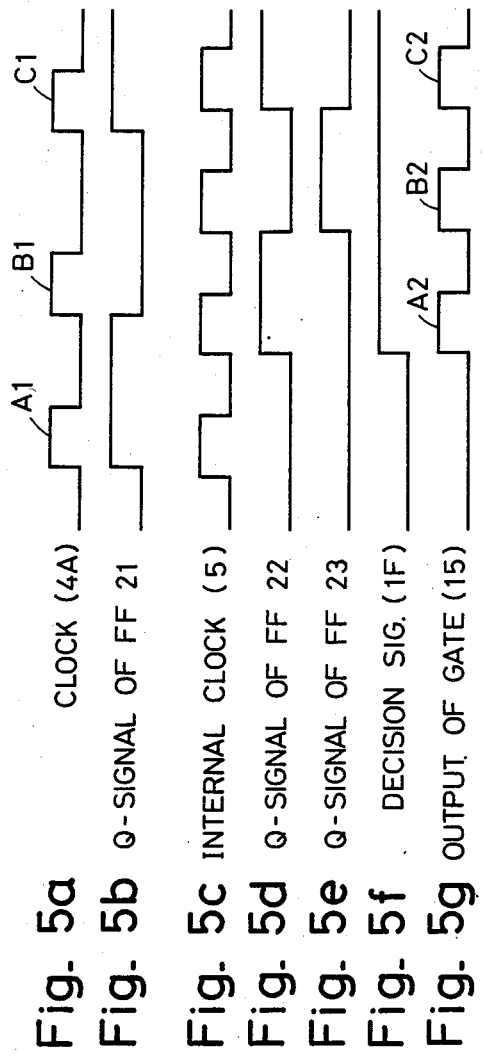

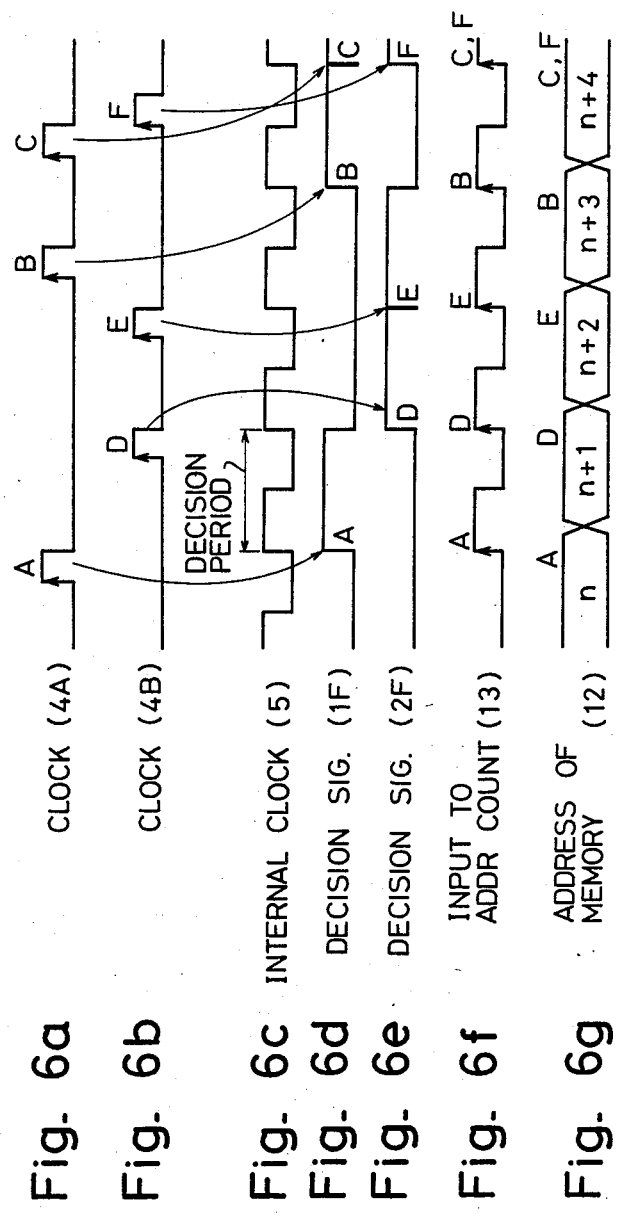

Fig. 7

| ADDRESS | MEMORY (1C) | MEMORY (2C) | MEMORY (12) ||
| --- | --- | --- | --- | --- |
| | | | 1F | 2F |
| ------ | ------ | ------ | ------ | ------ |
| ------ | ------ | ------ | ------ | ------ |
| n | A | × | 1 | 0 |
| n+1 | × | D | 0 | 1 |
| n+2 | × | E | 0 | 1 |
| n+3 | B | × | 1 | 0 |
| n+4 | C | F | 1 | 1 |
| ------ | ------ | ------ | ------ | ------ |
| ------ | ------ | ------ | ------ | ------ |

LOGIC ANALYZER HAVING A PLURALITY OF SAMPLING CHANNELS

BACKGROUND OF THE INVENTION

1. Field of the Invention

The present invention generally rleates to a logic analyzer. More particularly, the invention concerns such a type of logic analyzer which includes a plurality of sampling channels adapted to sample data with different clocks independent of one another and which can display sequential relationships in time among the sampled data.

2. Description of the Prior Art

The logic anaylzer is a sort of measuring instrument which is designed to sample input data with a clock pulse signal of a predetermined frequency and display the sampled data in the form of waveforms, list or the like.

Recently, there has been developed a logic analyzer which incorporates a plurality of sampling channels adapted to operate with respective clocks independent of one another.

FIG. 1 of the accompanying drawings shows schematically a circuit configuration of a sampling channel. In the figure, a reference symbol 1A denotes a data latch, 1B a sampling circuit, 1C a memory, and 1D an address counter. These elements 1A to 1D cooperate to constitute one sampling channel of a logic analyzer. Input data is supplied to a terminal 3A, while a clock pulse signal is applied to a terminal 4A from an internal or external sampling clock source.

The input data also denoted by 3A in inputted to the data latch 1A and sampled by the sampling circuit 1B with the clock pulse signal 4A, the sampled data being stored in the memory 1C. At that time, the address counter 1D is simultaneously incremented in response to the clock pulse 4A to designate the address of the memory 1C where the sampled data is to be stored.

FIG. 2 of the accompanying drawings shows a circuit configuration in which two sampling channels are employed. In the figure, rference symbols 11C and 11D denote sampling channels, respectively, 3A and 3B iput data, and 4A and 4B clock pulse signals, respectively. It should be understood that each of the sampling channels 11C and 11D includes the components 1A to 1D described above. Since the clock signals 4A and 4B ar ordinarily asynchronous with each other, the sequential relationship between the input data 3A of the sampling channel 11C and the input data 3B of the sampling channel 11D can not be determined. In other words, although the sequence in which the data is sampled in each sampling channel can be determined, the relationship in time between the different sampling channels can not be recognized. Consequently, difficulty is encountered in analyzing the relationship between the data signals processed with different clocks.

SUMMARY OF THE INVENTION

It is therefore an object of the present invention to provide a logic analyzer including a plurality of sampling channels adapted to operate with respective clock signals independent of one another and which analyzer can display the sequence in time in which data are sampled in the individual sampling channels.

In view of the above object, there is proposed according to an aspect of the invention a logic analyzer including a plurality of sampling channels operative with different clock signals, which comprises a clock discriminating circuit disposed in each of the sampling channels and having inputs supplied with the clock signal of the associated sampling channel and an internal clock signal, the discriminating circuit producing an output signal in synchronism with the internal clock signal to thereby cause input data to be stored in the associated sampling channel; a memory having inputs applied with the output signals of the clock discriminating circuits, respectively, for storing the sequence in time in which the iput data are sampled in the plurality of the sampling channels; and an address counter for updating the address of the memory in response to the outputs of the clock discriminating circuits; wherein upon every input of the clock signal to the sampling channels, the states of the output signals of the clock discriminating circuits are stored in the memory to thereby allow the sequence in time in which the input data are sampled in the plurality of sampling channels, to be displayed.

BRIEF DESCRIPTION OF THE DRAWINGS

FIGS. 5a–5g are diagrams showing timing charts for illustrating operation of the circuit shown in FIG. 4;

FIGS. 6a–6g are diagrams showing timing charts for illustrating operation of the system shown in FIG. 3; and FIG. 7 is a view for illustrating contents of memories (1C, 2C and 12) incorporated in the system shown in FIG. 3.

DESCRIPTION OF THE PREFERRED EMBODIMENTS

Now, the invention will be described in conjunction with an exemplary embodiment thereof by referring to FIG. 3 et seq.

Figure 3:
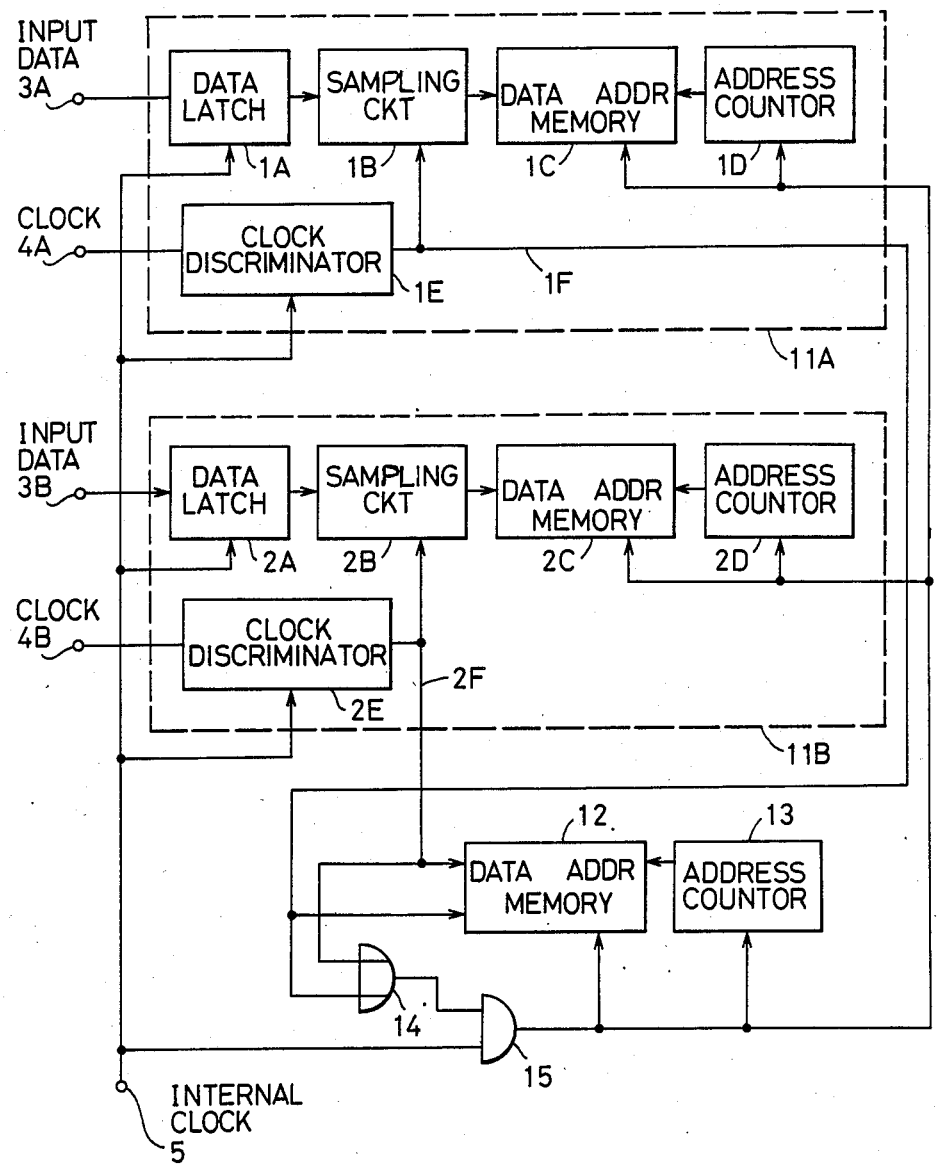
FIG. 3 is a block diagram showing an arrangement according to an exemplary embodiment of the invention.

In FIG. 3 reference symbols 11A and 11B denote sampling channels, respectively, 12 denotes a memory, 13 denotes an address counter, and 14 and 15 denote gate circuits, respectively.

Figure 1:
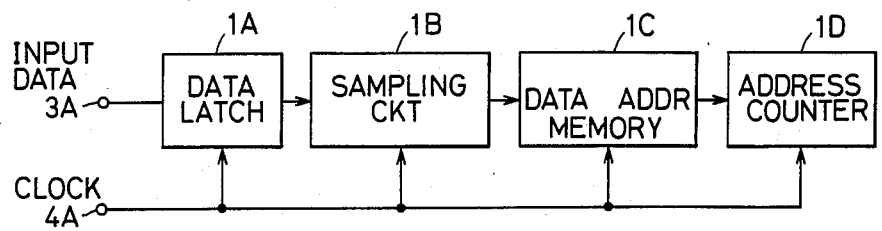
FIG. 1 is a block diagram shown an arrangement of a sampling channel adopted in a hitherto known logic analyzer.
Figure 2:
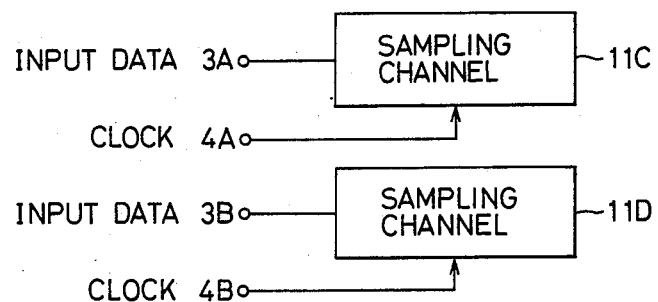
FIG. 2 is a block diagram showing an arrangement where two sampling channels are employed.

The sampling channel 11A includes a data latch 1A, a sampling circuit 1B, a memory 1C and an address counter 1D, as is with the case of the sampling channel described hereinbefore in conjucntion with FIG. 1. It will further be noted that the sampling channel 11A includes additionally a clock discriminating circuit 1E. Similarly, the sampling channel 11B includes a data latch 2A, a sampling circuit 2B, a memory 2C and an address counter 2D serving for the same functions as those shown in FIG. 1. Additionally, the sampling channel 11B includes a clock discriminating circuit 2E. Further, it is to be noted that both the sampling channels 11A and 11B operate under command of a clock signal 5 generated internally (hereinafter referred to as the internal clock signal).

The clock discriminating circuit 1E decides whether or not a clock pulse 4A makes appearance during each period of the internal clock signal, while the clock discriminating circuit 2E serves to decide whether or not a clock pulse 4B makes appearance during each period of the internal clock signal 5.

The output signal of the clock discriminating circuit 1E is supplied to the memory 12 as a decision signal 1F. Similarly, the output signal of the clock discriminating circuit 2E is supplied to the memory 12 as a decision signal 2F.

In the sampling channel 11A, the sampling circuit 3A responds to the decision signal 1F to sample the input data 3A in synchronism with the internal clock signal 5, the sampled data being stored in the memory 1C.

In a similar manner, in the sampling channel 11B, the sampling circuit 2B responds to the decision signal 2F to sample the input data 3B in synchronism with the internal clock signal 5, the smapled data being stored in the memory 2C.

On the other hand, the memory 12 is supplied with the decision signals 1F and 2F and stores the sequence in time in which the sampled data are produced in both the sampling channels 11A and 11B. More specifically, when the decision signal 1F or 2F makes appearance, a signal indicative of the sampling channel in which the data has been sampled is stored in the memory 12 at an allocated address. Simultaneously, the counter 13 is incremented to update the address of the memory 12.

In this way, it is possible to have the information about the sequential relationship in time between the input data 3A sampled and stored in the sampling channel 11A and the input data 3B sampled and stored in the sampling channel 11B.

Next, description will be made of an exemplary embodiment of the clock discriminating circuit 1E by referring to FIG. 4.

In the figure, reference numerals 21 to 23 denote flip-flops (FF), respectively, and 24 deontes an Exclusive-OR circuit (also referred to as EXOR).

The clock discriminating circuit 1E shown in FIG. 3 includes the flip-flops 21 to 22 and the EXOR 24. Each of the flip-flops 21 to 23 operates in such a manner in which the state on a terminal D is transferred to a terminal Q in response to the leading edge of the clock pulse applied to a terminal CK.

Figure 4:
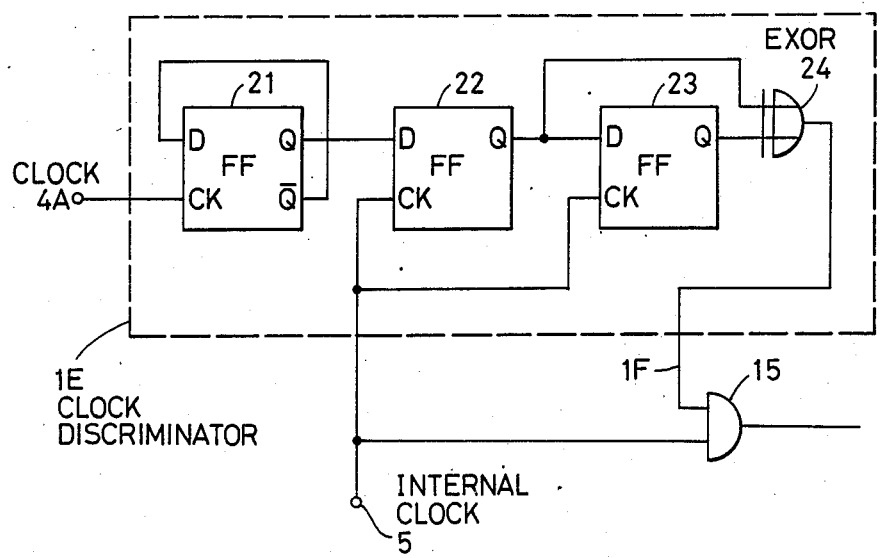
FIG. 4 is a schematic circuit diagram showing a circuit configuration of a clock discriminating circuit employed in the system shown in FIG. 3.

Operation of the circuit shown in FIG. 4 will be descirbed by referring to the timing chart illustrated in FIG. 5.

It is assumed that the clock signal 4A includes pulses A1, B1 and C1 as shown at (a) in FIG. 5. The clock signal 4A is applied to the terminal CK of the flip-flop 21 shown in FIG. 4. Since the flip-flop 21 is so implemented that the output thereof is inverted in response to every clock pulse of the clock signal 4A, the waveform of the signal produced at the terminal Q of the flip-flop 21 is such as shown in FIG. 5 at (b). The output signal of this waveform is applied to the terminal D of the flip-flop 22. Since the internal clock signal 5 shown at (c) in FIG. 5 is applied to the terminal CK of the flip-flop 22, the signal produced at the terminal Q of the flip-flop 22 is of such waveform as illustrated at (d) in FIG. 5. This signal (d, FIG. 5) is supplied to the terminal D of the flip-flop 23 and the EXOR 24. Since the internal clock signal 5 of the waveform illustrated at (c) in FIG. 5 is applied to the terminal CK of the flip-flop 23, the output signal at the terminal Q of the latter is of such waveform as shown at (e) in FIG. 5. This signal (e, FIG. 5) is applied to an input of the EXOR 24.

In this manner, the EXOR 24 has two inputs supplied with the signals illustrated at (d) and (e) in FIG. 5, respectively, as the result of which the decision signal 1F outputted from the EXOR 24 is of such waveform as illustrated at (f) i FIG. 5.

The AND gate 15 shown in FIG. 4 has two inputs to which the decision signal 1F illustrated at (f) in FIG. 5 and the internal clock signal illustrated at (c) in FIG. 5 are applied, respectively. The output signal of the AND gate 15 includes clock pulses A2, B2 and C2 as illustrated at (g) i FIG. 5. In other words, the clock pulses A2, B2 and C2 shown at (g) in FIG. 5 correspond, respectively, to the clock pulses A1, B1 and C1 illustrated at (a) in FIG. 5.

As will be seen from the foregoing description, the input data 3A shown in FIG. 3 can be stored in the memory 1C in synchronism with the internal clock signal 5 by sampling the output of the data latch 1A through the sampling circuit 1B in response to the decision signal 1F.

Next, operation of the system shown in FIG. 3 will be described by referring to the timing diagram shown in FIG. 6.

The waveform of the clock signal 4A is illustrated at (a) in FIG. 6, while that of the clock signal 4B is illustrated at (b). The waveform of the internal clock signal 5 is illustrated at (c) in FIG. 6, and that of the decision signal 1F is illustrated at (d). The signal 1F is produced in dependence on the signal illustrated at (a).

The decision signal 2F has a waveform illustrated at (e) in FIG. 6 and is produced in dependence on the signal illustrated at (b).

The waveform of the input signal to the address counter 13 is illustrated at (f) in FIG. 6 and includes the individual pulses of the signals (d) and (e) in the sequential order in which they are produced. The memory 12 has memory addresses arranged as shown at (g) in FIG. 6 where the pulses shown at (f) are stored in the sequence as illustrated.

FIG. 7 shows the contents of the memories 1C, 2C and 12. The decision signals 1F and 2F of logic "1" written in the memory 12 indicate that the associated data are stored in the memory 1C and 2C, respectively.

In the foregoing description, it has been assumed that two sampling channels are employed. It will however be understood that the intended display can be accomplished even when the number of the sampling channels is increased.

It will not be appreciated that the present invention has provided a logic analyzer which can give information about the sequence in time in which the sampled data are produced in the individual sampling channels.

What is claimed is:

1. A logic analyzer including a plurality of sampling channels operative with different clock signals, comprising:
   (a) a clock discriminating circuit disposed in each of said sampling channels and having inputs supplied with the clock signal of the associated sampling channel and an internal clock signal, said discriminating circuit producing an output signal in synchronism with said internal clock signal to thereby cause input data to be stored in the associated sampling channel;
   (b) a memory having inputs applied with the outut signals of said clock discriminating circuits, respectively, for storing sequence in time in which said input data are sampled in said plurality of the sampling channels; and (c) an address counter for updating the address of said memory in response to the outputs of said clock discriminating circuits.

wherein upon every input of said clock signal to said sampling channels, the states of the output signals of said clock discriminating circuits are stored in said memory.

2. A logic analyzer according to claim 1, wherein each of said sampling channels is composed of a data latch for latching an input data signal, a sampling circuit, a sampling channel memory for storing the sampled data, and a sampling channel address counter for updating the address of said memory, wherein said data latch, said memory and said address counter are operated under command of said internal clock signal, while said sampling circuit is operative in response to the output of said clock discriminating circuit.

* * * * *